United States Patent
Andersson et al.

(10) Patent No.: US 10,985,882 B2
(45) Date of Patent: Apr. 20, 2021

(54) CODE BLOCK SEGMENTATION BY OFDM SYMBOL

(71) Applicant: Telefonaktiebolaget LM Ericsson (publ), Stockholm (SE)

(72) Inventors: Mattias Andersson, Sundbyberg (SE); Robert Baldemair, Solna (SE); Yufei Blankenship, Kildeer, IL (US); Sara Sandberg, Luleå (SE)

(73) Assignee: Telefonaktieboiaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/482,967

(22) PCT Filed: Feb. 6, 2018

(86) PCT No.: PCT/SE2018/050102
§ 371 (c)(1),
(2) Date: Aug. 1, 2019

(87) PCT Pub. No.: WO2018/143891
PCT Pub. Date: Aug. 9, 2018

(65) Prior Publication Data
US 2020/0235873 A1 Jul. 23, 2020

Related U.S. Application Data

(60) Provisional application No. 62/455,046, filed on Feb. 6, 2017.

(51) Int. Cl.
*H04L 27/28* (2006.01)
*H04L 5/00* (2006.01)

(52) U.S. Cl.
CPC .......... *H04L 5/0044* (2013.01); *H04L 5/0007* (2013.01)

(58) Field of Classification Search
CPC ........................... H04L 5/0044; H04L 5/0007
(Continued)

(56) References Cited

U.S. PATENT DOCUMENTS

RE46,810 E * 4/2018 Jin ...................... H04L 27/2628
2010/0239035 A1 9/2010 Blankenship et al.
(Continued)

FOREIGN PATENT DOCUMENTS

WO 2016 165575 A1 10/2016

OTHER PUBLICATIONS

3GPP TS 36.212 v14.1.1; Technical Specification; 3rd Generation Partnership Project; Technical Specification Group Radio Access Network; Evolved Universal Terrestrial Radio Access (E-UTRA); Multiplexing and channel coding (Release 14)—Jan. 2017.
(Continued)

*Primary Examiner* — Don N Vo
(74) *Attorney, Agent, or Firm* — Christopher & Weisberg, P.A.

(57) ABSTRACT

According to some embodiments, a method in a wireless transmitter of aligning code blocks with modulation symbols comprises: receiving a block of information bits for wireless transmission in a plurality of modulation symbols; partitioning the plurality of modulation symbols into groups of one or more modulation symbols, wherein the modulation symbols in a group are contiguous in time; and assigning each of the information bits to one of the groups. For each of the groups the method further comprises: segmenting the assigned information bits in the group into one or more code blocks; encoding each code block into coded bits; and assigning the coded bits of the one or more code blocks to the group of modulation symbols the information bits are assigned to. The method further comprises transmitting the groups of modulation symbols to a wireless receiver.

14 Claims, 4 Drawing Sheets

(58) Field of Classification Search
USPC .......................................... 375/260; 370/295
See application file for complete search history.

(56) References Cited

U.S. PATENT DOCUMENTS

2016/0028505 A1    1/2016  Pi et al.
2016/0352481 A1*  12/2016  Jiang ................. H04W 72/0446
2017/0026297 A1    1/2017  Sun et al.
2018/0123847 A1    5/2018  Xu et al.
2019/0327024 A1*  10/2019  Lee ..................... H04L 27/2628

OTHER PUBLICATIONS

3GPP TSG RAN WG1 Ad hoc; Spokane, USA; Source: Intel Corporation; Title: Data channel encoding chain (R1-1700382)—Jan. 16-20, 2017.
3GPP TSG RAN WG1 Meeting #89; Hangzhou, P.R. China; Source: Ericsson; Title: Code Block Segmentation (R1-1707065)—May 15-19, 2017.
PCT International Search Report for International application No. PCT/SE2018/050102—dated Jun. 26, 2018.
PCT Written Opinion of the International Searching Authority for International application No. PCT/SE2018/050102—dated Jun. 26, 2017.
3GPP TSG RAN WG1 NR Ad-Hoc Meeting; Spokane, USA; Source: Samsung; Title: TB/CB Handling for eMBB (R1-1700958)—Jan. 16-20, 2017.
Extended European Search Report issued for Application No./Patent No. 18747456.4-1220 / 3577762 PCT/SE2018050102—dated Oct. 26, 2020.

* cited by examiner

CODE BLOCK SEGMENTATION BY OFDM SYMBOL

PRIORITY

This nonprovisional application is a U.S. National Stage Filing under 35 U.S.C. § 371 of international Patent Application Serial No. PCT/SE2018/050102 filed Feb. 6, 2018 and entitled "CODE BLOCK SEGMENTATION BY OFDM SYMBOL" which claims priority to U.S. Provisional Patent Application No. 62/455,046 filed Feb. 6, 2017 both of which are hereby incorporated by reference in their entirety.

TECHNICAL FIELD

Particular embodiments are directed to wireless communications and, more particularly, to, segmenting code blocks per orthogonal frequency division multiplexing (OFDM) symbol.

BACKGROUND

The Third Generation Partnership Project (3GPP) long term evolution (LTE) standard (3GPP TS 36.212 V14.1.1, Section 5.1.2) specifies that code block segmentation (CBS) is performed when the size of the transport block with additional cyclic redundancy check (CRC) exceeds the maximum code block size of 6144 bits prior to Turbo encoding. When this occurs, the transport block with additional CRC is segmented into smaller code blocks together by insertion of an additional CRC sequence of L=24 bits to each code block.

How the CBS is performed affects successive interference cancellation (SIC) of interference from different spatially multiplexed signals. SIC may be applied if the spatially multiplexed signals are separately coded in different code blocks before the spatial multiplexing. Using SIC, the receiver first demodulates and decodes one of the spatially multiplexed signals. If decoding is successful, the decoded data is re-encoded and subtracted from the received signals. A second spatially multiplexed signal may then be demodulated and decoded with improved signal to noise ratio (SNR), because the interference from the first signal is removed to a large extent. After successful decoding, the second spatially multiplexed signal may be subtracted from the received signals as well. This process can be repeated until all spatially multiplexed signals have been decoded.

When applying SIC, the first signals to be decoded are subject to more interference than signals to be decoded later in the process when some interference has been removed. Therefore, different modulation and coding schemes can be applied to the different spatially multiplexed signals.

Fifth generation (5G) New Radio (NR) includes CRC attachment. For NR, CRC may be attached on a code-block group (CBG) level in addition to, or instead of, attaching CRC on a code-block level. A code-block group is a set of one or more code blocks. If CRC bits are attached on CBG level, the CRC bits may be transmitted together with any of the code blocks in the group, or spread out over several of the code blocks in the group.

A problem with existing solutions is that the LTE type of CBS does not include alignment between code blocks and orthogonal frequency division multiplexing (OFDM) symbols. A large fraction of the code blocks may thereby be partially transmitted in two different OFDM symbols. If a code block is transmitted during two consecutive OFDM symbols, it cannot be decoded until it has been completely received in the second OFDM symbol. This in turn means that acknowledgements (ACKs)/negative acknowledgements (NACKs) may be delayed.

Furthermore, when using SIC, the interference from the partially received code block cannot be subtracted from the signals in the first OFDM symbol until the whole code block has been received in the second OFDM symbol. A pipelined processing of each OFDM symbol is more difficult if a code block spans over the OFDM symbol border, especially if a large part of the coded bits in a code block is transmitted in a later OFDM symbol.

SUMMARY

The embodiments described herein include aligning code blocks with orthogonal frequency division multiplexing (OFDM) symbol borders. Perfect alignment, where an integer number of code blocks is transmitted in each OFDM symbol, is one embodiment. However, because this may lead to significantly shorter code blocks than in the case with no alignment, some embodiments perform alignment for groups of OFDM symbols. The group size may be increased until a suitable trade-off between alignment and code block size is reached.

According to some embodiments, a method in a wireless transmitter of aligning code blocks with modulation symbols comprises: receiving a block of information bits for wireless transmission in a plurality of modulation symbols; partitioning the plurality of modulation symbols into groups of one or more modulation symbols, wherein the modulation symbols in a group are contiguous in time; and assigning each of the information bits to one of the groups. For each of the groups the method further comprises: segmenting the assigned information bits in the group into one or more code blocks; encoding each code block into coded bits; and assigning the coded bits of the one or more code blocks to the group of modulation symbols the information bits are assigned to. The method further comprises transmitting the groups of modulation symbols to a wireless receiver.

In particular embodiments, each of the one or more code blocks are of generally equal size. The plurality of modulation symbols may comprise a plurality of OFDM symbols.

In particular embodiments, segmenting the assigned information bits in the group into one or more code blocks is based on at least one of a modulation and coding scheme (MCS) for the wireless transmission, a number of physical resource blocks (PRBs) in a scheduling assignment for the wireless transmission, and a transport block size for the wireless transmission. The method may further comprise aligning the code blocks to boundaries of the modulation symbol groups.

In particular embodiments, partitioning the plurality of modulation symbols is based on a weighting factor assigned to each modulation symbol of the plurality of modulation symbols. The weighting factor may be based on at least one of a number of resource elements in the modulation symbol available for data transmission, and a power level associated with the modulation symbol.

In particular embodiments, the wireless transmitter comprises a network node or a wireless device.

According to some embodiments, a wireless transmitter comprises processing circuitry. The processing circuitry is operable to: receive a block of information bits for wireless transmission in a plurality of modulation symbols; partition the plurality of modulation symbols into groups of one or more modulation symbols, wherein the modulation symbols in a group are contiguous in time; and assign each of the information bits to one of the groups. For each of the groups, the processing circuitry is further operable to: segment the assigned information bits in the group into one or more code blocks; encode each code block into coded bits; and assign the coded bits of the one or more code blocks to the group of modulation symbols the information bits are assigned to. The processing circuitry is further operable to transmit the groups of modulation symbols to a wireless receiver.

In particular embodiments, each of the one or more code blocks are of generally equal size. The plurality of modulation symbols may comprise a plurality of OFDM symbols.

In particular embodiments, the processing circuitry is operable to segment the assigned information bits in the group into one or more code blocks based on at least one of a MCS for the wireless transmission, a number of PRBs in a scheduling assignment for the wireless transmission, and a transport block size for the wireless transmission. The processing circuitry may be operable to align the code blocks to boundaries of the modulation symbol groups.

In particular embodiments, the processing circuitry is operable to partition the plurality of modulation symbols based on a weighting factor assigned to each modulation symbol of the plurality of modulation symbols. The weighting factor may be based on at least one of a number of resource elements in the modulation symbol available for data transmission, and a power level associated with the modulation symbol.

In particular embodiments, the wireless transmitter comprises a network node or a wireless device.

Also disclosed is a computer program product. The computer program product comprises instructions stored on non-transient computer-readable media which, when executed by a processor, perform the steps of: receiving a block of information bits for wireless transmission in a plurality of modulation symbols; partitioning the plurality of modulation symbols into groups of one or more modulation symbols, wherein the modulation symbols in a group are contiguous in time; and assigning each of the information bits to one of the groups. For each of the groups, the instructions further perform the steps of: segmenting the assigned information bits in the group into one or more code blocks; encoding each code block into coded bits; and assigning the coded bits of the one or more code blocks to the group of modulation symbols the information bits are assigned to. The instructions further perform the step of transmitting the groups of modulation symbols to a wireless receiver.

Particular embodiments may exhibit some of the following technical advantages. For example, the hardware for a wireless receiver may be used more efficiently in a pipelined fashion if the OFDM symbols can be processed independently. Furthermore, ACK/NACKs can be sent earlier on average and successive interference cancellation may be performed in the current OFDM symbol to a larger extent, which reduces the latency. Other technical advantages will be readily apparent to one skilled in the art from the following figures, description and claims.

BRIEF DESCRIPTION OF THE DRAWINGS

For a more complete understanding of the embodiments and their features and advantages, reference is now made to the following description, taken in conjunction with the accompanying drawings, in which.

DETAILED DESCRIPTION

Figure 1:
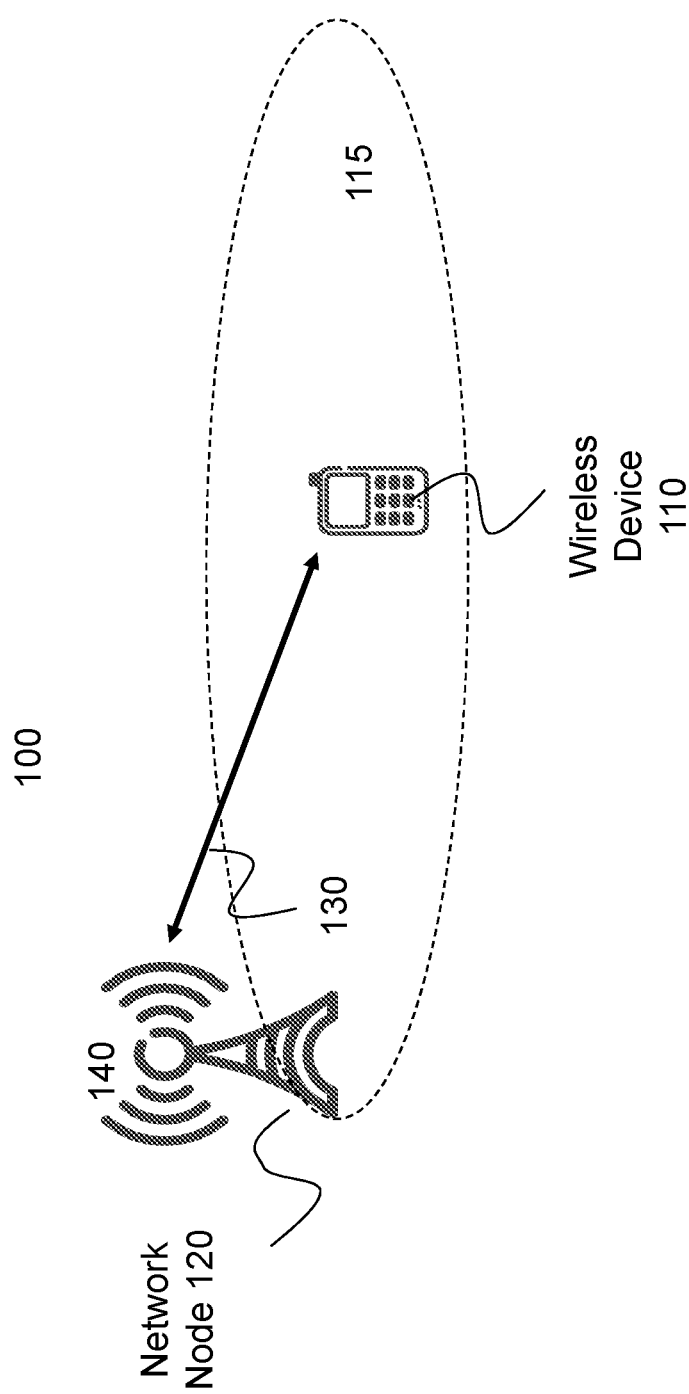
FIG. 1 is a block diagram illustrating an example wireless network, according to some embodiments.
Figure 2:
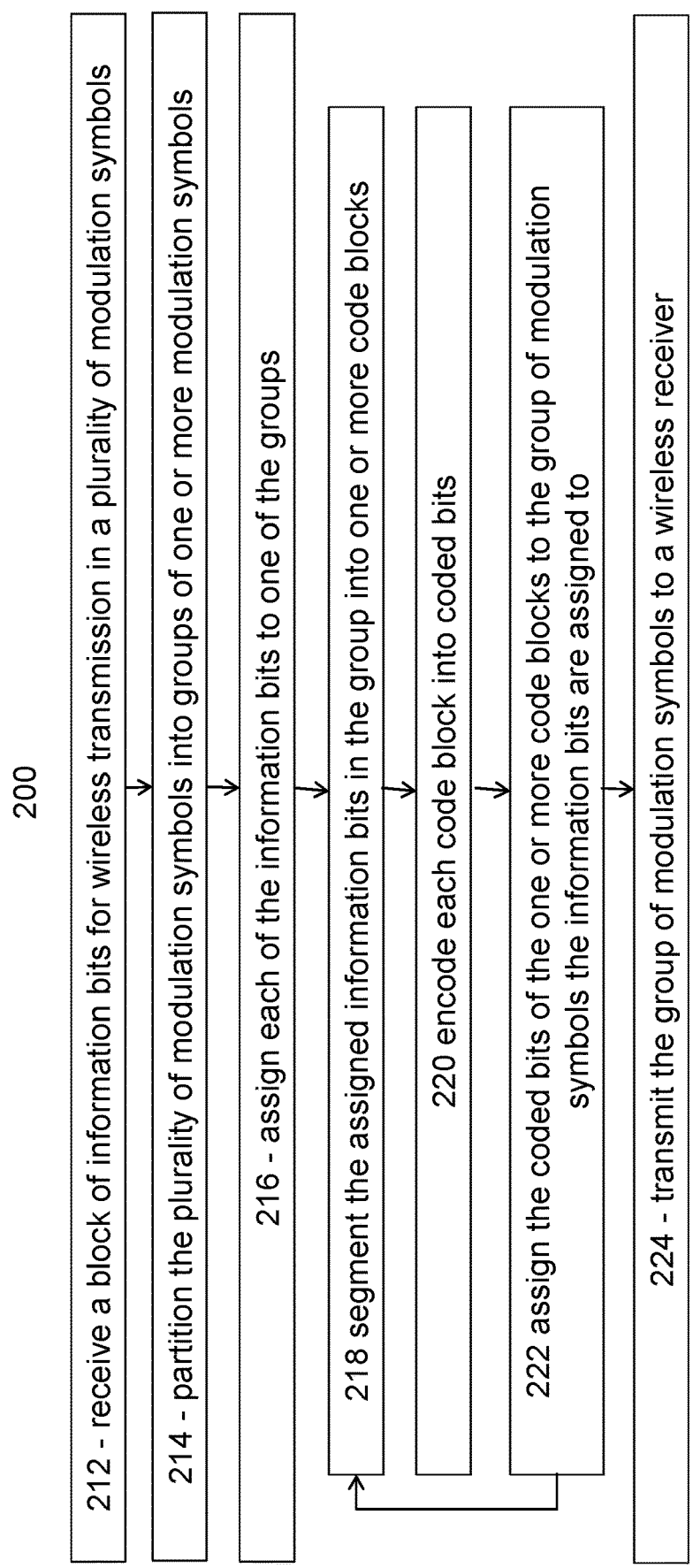
FIG. 2 is a flow diagram illustrating an example method in a wireless transmitter, according to some embodiments.

The Third Generation Partnership Project (3GPP) long term evolution (LTE) standard (3GPP TS 36.212 V14.1.1, Section 5.1.2) specifies that code block segmentation (CBS) is performed when the size of the transport block with additional cyclic redundancy check (CRC) exceeds the maximum code block size of 6144 bits prior to Turbo encoding. How the CBS is performed affects successive interference cancellation (SIC) of interference from different spatially multiplexed signals.

A problem with existing solutions is that the LTE type of CBS does not include alignment between code blocks and orthogonal frequency division multiplexing (OFDM) symbols. A large fraction of the code blocks may thereby be partially transmitted in two different OFDM symbols. If a code block is transmitted during two consecutive OFDM symbols, it cannot be decoded until it has been completely received in the second OFDM symbol. This in turn means that ACK/NACKs may be delayed.

Furthermore, when using SIC, the interference from the partially received code block cannot be subtracted from the signals in the first OFDM symbol until the whole code block has been received in the second OFDM symbol. A pipelined processing of each OFDM symbol is more difficult if a code block spans over the OFDM symbol border, especially if a large part of the coded bits in a code block is transmitted in a later OFDM symbol.

Particular embodiments obviate the problems described above and include aligning code blocks with OFDM symbol borders. Perfect alignment, where an integer number of code blocks is transmitted in each OFDM symbol, is one embodiment. However, because this may lead to significantly shorter code blocks than in the case with no alignment, some embodiments perform alignment for groups of OFDM symbols. The group size may be increased until a suitable trade-off between alignment and code block size is reached.

In particular embodiments, the hardware for a wireless receiver may be used more efficiently in a pipelined fashion if the OFDM symbols can be processed independently. Furthermore, ACK/NACKs can be sent earlier on average and successive interference cancellation may be performed in the current OFDM symbol to a larger extent, which reduces the latency.

The following description sets forth numerous specific details. It is understood, however, that embodiments may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments, whether or not explicitly described.

Particular embodiments are described with reference to FIGS. 1-4B of the drawings, like numerals being used for like and corresponding parts of the various drawings. LTE and NR are used throughout this disclosure as an example cellular system, but the ideas presented herein may apply to other wireless communication systems as well.

FIG. 1 is a block diagram illustrating an example wireless network, according to a particular embodiment. Wireless network 100 includes one or more wireless devices 110 (such as mobile phones, smart phones, laptop computers, tablet computers, MTC devices, or any other devices that can provide wireless communication) and a plurality of network nodes 120 (such as base stations, eNodeBs, gNBs, etc.). Wireless device 110 may also be referred to as a UE. Network node 120 serves coverage area 115 (also referred to as cell 115).

In general, wireless devices 110 that are within coverage of network node 120 (e.g., within cell 115 served by network node 120) communicate with network node 120 by transmitting and receiving wireless signals 130. For example, wireless devices 110 and network node 120 may communicate wireless signals 130 containing voice traffic, data traffic, and/or control signals. A network node 120 communicating voice traffic, data traffic, and/or control signals to wireless device 110 may be referred to as a serving network node 120 for the wireless device 110. Communication between wireless device 110 and network node 120 may be referred to as cellular communication. Wireless signals 130 may include both downlink transmissions (from network node 120 to wireless devices 110) and uplink transmissions (from wireless devices 110 to network node 120).

Each network node 120 may have a single transmitter 140 or multiple transmitters 140 for transmitting signals 130 to wireless devices 110. In some embodiments, network node 120 may comprise a multi-input multi-output (MIMO) system. Similarly, each wireless device 110 may have a single receiver or multiple receivers for receiving signals 130 from network nodes 120 or other wireless devices 110.

Wireless signals 130 may be transmitted by a wireless transmitter, such as network node 120 or wireless device 110, by partitioning the plurality of modulation symbols into groups of one or more modulation symbols. The modulation symbols in a group are contiguous in time. The wireless transmitter assigns each of the information bits to one of the groups. For each of the groups, the wireless transmitter segments the assigned information bits in the group into one or more code blocks, encodes each code block into coded bits, and assigns the coded bits of the one or more code blocks to the group of modulation symbols the information bits are assigned to. The wireless transmitter transmits the group of modulation symbols to a wireless receiver, such as wireless device 110 or network node 120.

In particular embodiments, the wireless receiver (e.g., wireless device 110, network node 120) may process the OFDM symbols independently in a pipelined fashion, which improves efficiency. Furthermore, the wireless receiver may send ACK/NACKs earlier on average, which reduces latency. The wireless receiver may perform successive interference cancellation in the current OFDM symbol to a larger extent, which also reduces the latency.

In wireless network 100, each network node 120 may use any suitable radio access technology, such as long term evolution (LTE), LTE-Advanced, UMTS, HSPA, GSM, cdma2000, NR, WiMax, WiFi, and/or other suitable radio access technology. Wireless network 100 may include any suitable combination of one or more radio access technologies. For purposes of example, various embodiments may be described within the context of certain radio access technologies. However, the scope of the disclosure is not limited to the examples and other embodiments could use different radio access technologies.

As described above, embodiments of a wireless network may include one or more wireless devices and one or more different types of radio network nodes capable of communicating with the wireless devices. The network may also include any additional elements suitable to support communication between wireless devices or between a wireless device and another communication device (such as a landline telephone). A wireless device may include any suitable combination of hardware and/or software. For example, in particular embodiments, a wireless device, such as wireless device 110, may include the components described with respect to FIG. 3A below. Similarly, a network node may include any suitable combination of hardware and/or software. For example, in particular embodiments, a network node, such as network node 120, may include the components described with respect to FIG. 4A below.

Generally, particular embodiments transmit a block of information bits (e.g., a transport block) during two or more OFDM symbols. Particular embodiments achieve alignment between OFDM symbol borders and code block borders through the following steps:

1. The OFDM symbols are partitioned into groups of one or more OFDM symbols. The OFDM symbols in a group are contiguous in time.
2. The information bits in the transport block are assigned to the different groups.
3. For each group, perform the following:
    a. If needed, further segment the set of information bits in the group into smaller code blocks.
    b. Separately encode each code block into coded bits
    c. For each code block, assign the coded bits to the group of OFDM symbols the information bits are assigned to.

After the coded bits are assigned to OFDM symbols, they can be converted to physical signals through, for example, QAM-modulation and OFDM, or QAM-modulation and DFT-spread OFDM. Optionally, the coded bits from different code blocks assigned to the same group of OFDM symbols can be interleaved before modulation.

CRC bits can be attached to the different sets of information bits in different steps of the method. For example, transport block level CRC bits can be attached to the set of information bits before starting the algorithm. Similarly, code block level CRC bits can be attached to each code block before step 3b), or code block group level CRC bits can be attached to a group of code blocks before step 3 or step 3a). In particular embodiments the code block level groups can be different from the groups of OFDM symbols the information bits are assigned to.

In step 3a), it is beneficial if the code blocks are of roughly equal size. This may be achieved through a process similar to the LTE process in 3GPP specifications. A specific example is given below.

In step 3a), another way of doing the segmentation includes LDPC segmentation. For example, given a fixed maximum codeword length, which the LDPC decoder hardware is provisioned to support, the code block segmentation method divides the information bits of the transport block into code blocks based on desired code rate and the minimum code rate that the LDPC code has been extended to.

The embodiments described herein use OFDM symbols as the time units that are divided into groups. The embodiments, however, may also be applied to other modulation schemes where certain bits are transmitted during a specific time interval.

In some embodiments, a group consists of one OFDM symbol. Step 2 is performed by assigning information bits to groups as evenly as possible. In many cases it is not possible to do this, so the group size will differ by one bit between some groups. Let TBS denote the number of information bits, including any CRC bits attached on transport block level. Some groups will have $$\left\lfloor \frac{TBS}{N_{OFDM}} \right\rfloor$$

bits assigned to them, while some will have $$\left\lfloor \frac{TBS}{N_{OFDM}} \right\rfloor + 1$$

bits assigned, where the notation $\lfloor x \rfloor$ means floor(x), i.e. the largest integer which is smaller than or equal to x. Here $N_{OFDM}$ is the number of OFDM symbols that will carry data in the transmission. The number of groups with the larger number of bits is chosen so that the total number of bits equals the TBS.

In another similar embodiment, steps 1 and 2 are performed with one OFDM symbol per group, with the result that $K_{symbol,j}$ information bits being associated with OFDM symbol j.

Step 3a) is performed as follows: Each set of $K_{symbol,j}$ information bits is treated separately in the following manner:

If $K_{symbol,j}$ is larger than a maximum code block size $K_{max}$, minus the number of CRC bits that should be attached to each code block, it is divided into $N_{CB,j}$ code blocks of roughly equal size, where $N_{CB,j}$ is given by $$N_{CB,j} = \left\lceil \frac{K_{symbol,j}}{K_{max} - N_{CRC}} \right\rceil$$

Here $N_{CRC}$ is the number of CRC bits to attach to each code block, which might not be fixed.

The size of the 1:th code block transmitted in OFDM symbol j is given by $$K_{CB,j,l} = \left\lfloor \frac{K_{symbol,j}}{N_{CB,j}} \right\rfloor + A_l + N_{CRC}$$

where $A_l$ is set to 0 or 1 depending on the impact of the rounding downwards. As an example, calculate $K_{CB,k,l}$ assuming that $A_l=0$, then select $A_l=1$ for $1 \le l \le K_{symbol,j} - K_{CB,j,l} \cdot N_{CB,j}$ to make sure that there are exactly $K_{symbol,j}$ information bits in the $j^{th}$ OFDM symbol.

In some cases, code block sizes with one-bit granularity may not be desired. If only a subset of the code block sizes is allowed, the two different values of $K_{CB,j,l}$ for a given j and different l should instead be chosen from a subset of allowed code block sizes. In a variation of this embodiment, the smaller value is the largest value in the subset that is smaller than or equal to $$\frac{K_{symbol,j} + N_{CB,j} N_{CRC}}{N_{CB,j}}$$

while the larger value is the next larger value in the subset. The number of code blocks of the two sizes should be chosen so that the sum of the sizes in group j becomes $K_{symbol,j} + N_{CB,j} N_{CRC}$. In some cases there is only one code block size. Shortening may also be used in this case.

Steps 3b), 3c) and the mapping to physical resources can be performed as follows:
 a. To each code block $N_{CRC}$ CRC bits are attached.
 b. Each code block with CRC bits is encoded using an error correcting code, resulting in a codeword consisting of coded bits.
 c. The different codewords are concatenated.
 d. Optionally, the concatenated codewords are interleaved.
 e. The result after concatenation (and interleaving, if performed) are modulated and mapped to OFDM symbol j (where applicable, this also includes DFTS-OFDM where the modulation symbols are DFT-precoded prior to OFDM modulation).

For the rest of the embodiments, the following notation is used:
 $N_{OFDM}$ is the number of OFDM symbols in the transmission
 TBS is the transport block size of the transmission, including the number of CRC bits attached on transport-block level
 $K_{max}$ is the maximum number of information bits that the channel code can handle
 $K_{CB,max}$ is the maximum code-block size, excluding the CRC bits attached on code-block level
 $K_{CB}$ is the code block size
 $N_{CRC}$ is the number of CRC bits attached on code-block level
 $N_{CB}$ is the total number of code blocks in the transmission
 $W_j$ is the weight of the $j^{th}$ OFDM symbol
 $\Delta$ is a constant used for determining if the actual code block size $K_{CB}$ is close enough to the maximum code block size $K_{CB,max}$ The input to the proposed code block segmentation method is the modulation and coding scheme (MCS) index, the number of PRBs in the scheduling assignment, and the TBS. In LTE, the MCS index combined with the number of PRBs is mapped to a TBS through a table, and in this case the TBS may not be specifically stated as an input parameter.

The maximum code-block size, excluding the CRC bits attached on code-block level, $K_{CB,max}$, may be calculated as $$K_{CB,max} = K_{max} - N_{CRC}$$

$K_{max}$ typically depends on the code design and hardware limitations and may also be dependent on the code rate of the transmission. $K_{max}$ may have a different value for different transmissions. For the quasi-cyclic LDPC codes proposed for NR, $K_{max}$ may be calculated based on the maximum codeword length that the hardware is provisioned for, the maximum cyclic shift, the number of punctured information bits, and the code rate of the transmission.

Particular embodiments may include weight factors for the OFDM symbols. For example, steps 1 and 2 in the general description of the embodiments described above may be improved by accounting for other signals that are multiplexed on some OFDM symbols (e.g., reference signals, synchronization signals, and in some cases control signals). If known in advance, entire time-frequency tiles may be reserved for other transmissions.

The following description applies to the case where each group consists of one OFDM symbol. This means that different OFDM symbols will have different number of REs available for data. In one embodiment, instead of partitioning the information bits equally between OFDM symbols, the number of information bits to assign to an OFDM symbol is weighted proportionally to the number of available REs for data transmission in the OFDM symbol, compared to the total number of REs available for data transmission in the transmission. As in the general description of the embodiments above, if the number of information bits cannot be partitioned according to the weighting, extra bits can be assigned in a systematic manner. After associating the information bits to the OFDM symbols, each set is treated separately according to the embodiments above.

Particular embodiments may use weight factors in step 2. As in the above embodiments, each group consists of one OFDM symbol. In step 2, the number of information bits assigned to group j is given by $\lceil TBS \cdot W_j \rceil$ or $\lfloor TBS \cdot W_j \rfloor$. As above, the total number of bits assigned adds up to TBS. Because the number of bits assigned to different groups can vary if the weights vary, the methods on how to add the extra bits can account for it. One method of assigning these bits is to add them to the groups with the fewest number of bits first. Another is to add them to the groups with the largest number of bits first.

In a variation of this embodiment, the groups of OFDM symbols contain more than one OFDM symbol each. In this case the number of information bits assigned to group g is given by $\lceil TBS \cdot \Sigma_{j \in g} W_j \rceil$ or $\lfloor TBS \cdot \Sigma_{j \in g} W_j \rfloor$ i.e. the weights of the sum of the OFDM symbols in group g are summed before determining the number of information bits assigned to group g.

Particular embodiments may align code blocks to boundaries of OFDM symbol groups. When grouping OFDM symbols into many groups, the code block size used in each group is generally smaller compared to when making fewer groups. It is preferable from a channel coding perspective to have larger code blocks, leading to lower probability of erroneous decoding at the receiver. Therefore, particular embodiments may perform step 1 in following way, which can be used to increase the group size in a systematic manner. The impact on a pipelined implementation is small because the data rate is rather small (many OFDM symbols are needed to accommodate one large code block), i.e. even if the decoding can only start after the group of OFDM symbols has been received, it is still no problem for the receiver because the amount of data to decode is small.

Let $\Delta$ be a constant. Particular embodiments will make the groups as small as possible while still ensuring that the smallest code block size $K_{min}$ that results from this grouping is larger than or equal to $K_{CB,max} - \Delta$.
  A. Choose an initial grouping of OFDM symbols
  B. Perform steps 2) and 3a) and find the smallest code block size $K_{min}$ allocated to any of the groups
  C. If $K_{min} < K_{CB,max} - \Delta$, and there are more groupings to try choose another grouping of OFDM symbols, go to B).
     else
       finish
     end One way of choosing the initial grouping of OFDM symbols is to let each group contain one OFDM symbol.

In step C) there are many ways of choosing another grouping. One way is to increase the minimum group size, where group size refers to the number of OFDM symbols (or the sum of the weights $W_j$ for the OFDM symbols in the group) in each step. In general, the order in which the groupings are tried may be with groupings that are more beneficial for hardware implementation being tried first. One way of accomplishing this is to try groupings with groups containing fewer OFDM symbols each before groupings with more OFDM symbols each.

In some cases, choosing other groupings does not increase $K_{min}$. In these cases, the first ordering leading to the largest $K_{min}$ found is used. Alternatively, one of the groupings with smallest average group size can be chosen.

Particular embodiments include CRC attachment. It is assumed here that $N_{CRC}$ is a constant. However, the number of CRC bits to attach on code block level may vary depending on the code block size. In this case, the procedure described may be applied assuming that $N_{CRC}$ is a low number. If it turns out that $N_{CRC}$ is too low for the actual code block lengths $K_{CB}$, $N_{CRC}$ may be increased and the procedure applied again until $N_{CRC}$ is large enough to fulfill the constraints on error detection for the code block lengths $K_{CB}$. Instead of, or in addition to, attaching CRC bits to every code block, particular embodiments may attach CRC bits to groups of code blocks.

Particular embodiments account for power ramp-up and ramp-down at OFDM symbol boundaries. A typical power amplifier needs some time to ramp-up and ramp-down the transmit power in the start and end of a transmission. This means that some OFDM symbols may be transmitted with less average power (less energy) than others, or that some OFDM symbols close to the beginning or end of the transmission become distorted. By taking this into account in the selection of weight $W_i$ of the OFDM symbols, the payload can be distributed in a better way in the different OFDM symbols or groups of OFDM symbols. Generally, the OFDM symbols close to a transmission boundary would receive a lower weight.

Another alternative is to make sure that OFDM symbols with lower transmit power (energy) are grouped with one or several consecutive OFDM symbols. If the transmitted bits are interleaved such that one codeword is transmitted over a larger time interval, the impact of the low transmit power of the first and last OFDM symbols, due to power amplifier ramp-up and ramp-down, will hit several codewords instead of just the first and the last. If the code words impacted most by the lower power are transmitted across multiple symbols, this effect is mitigated.

Particular embodiments may include sidelink communications. The power ramping description may also apply to sidelink communication.

Some embodiments permit some OFDM symbol misalignment between code blocks. When operating the hardware in a pipelined fashion or from a SIC perspective, having some coded bits from a code block in a neighboring group of OFDM symbols might not be that detrimental. A situation to avoid is when the majority of a code block is transmitted in one OFDM symbol, with a small part stretching in the next OFDM symbol, but if due to some irregularities a small part already starts in the preceding symbol it is not a problem.

For example, a code block may start with some bits in OFDM symbol n and its main part in OFDM symbol n+1. With respect to SIC, a UE cannot decode this particular code block, but given that it is small its impact is accordingly small (especially if interleaved across all subcarriers of OFDM symbol and coded bits from different code blocks are not mapped to the same (QAM) constellation).

With respect to pipeline, a UE cannot start to decode the code block and the decoder has therefore a small backlog (this code block will only be decoded in OFDM symbol n+2 and not n+1, but this code block in principle anyway belongs to OFDM symbol n+1 (where its main part is transmitted). Therefore, no significant effect on pipelining is expected. When the code block stretches with a few bits in the next OFDM symbol, the result is negative for SIC (because now the CB interference can be large and cannot be removed) and also pipeline would be delayed.

One way of achieving this is to change step 2) of the algorithm by reserving some part of the OFDM symbol preceeding one or more groups of OFDM symbols for coded bits belonging to code blocks of the groups, and adjusting the weights $W_j$ accordingly. The code block sizes that this leads to can be compared to an assignment where this is not done to see if the code block sizes are improved.

In general, the embodiments described herein partition the OFDM symbols in a transmission into groups, assign information bits from one or more transport blocks to these groups, and perform code block segmentation for each of these groups separately. This facilitates each group of OFDM symbols to be treated separately from a channel coding perspective, enabling pipelined hardware.

Particular embodiments may include methods in a transmitter. The embodiments and examples described above may be generally represented by FIG. 2A.

FIG. 2A is a flow diagram illustrating an example method in a wireless transmitter, according to some embodiments. In particular embodiments, one or more steps of FIG. 2A may be performed by components of wireless network 100 described with respect to FIG. 1.

The method begins at step 212, where the wireless transmitter, such as network node 120 or wireless device 110, receives a block of information bits for wireless transmission in a plurality of modulation symbols. The modulation symbol may comprise an OFDM symbol or any other suitable modulation symbol.

At step 214, the wireless transmitter partitions the plurality of modulation symbols into groups of one or more modulation symbols. For example, network node 120 may partition a plurality of modulation symbols according to any of the embodiments or examples described above (e.g., Step 1 described above).

In particular embodiments, the wireless transmitter partitions the plurality of modulation symbols based on a weighting factor assigned to each modulation symbol of the plurality of modulation symbols. The weighting factor may be based on at least one of a number of resource elements in the modulation symbol available for data transmission, and a power level associated with the modulation symbol. Particular examples of partitioning using a weighting factor are described above.

At step 216, the wireless transmitter assigns each of the information bits to one of the groups. For example, network node 120 may assign each of the information bits to one of the groups according to any of the embodiments or examples described above (e.g., Step 2 described above). For example, in some embodiments the wireless transmitter assigns information bits to groups as evenly as possible. When not possible, some group sizes may differ by one bit.

In particular embodiments, the wireless transmitter assigns information bits to groups based on a weighting factor assigned to each group. The weighting factor may be based on available resources (e.g., number of reference signals already present in the group of symbols) and/or power levels, for example.

At step 218, the wireless transmitter segments the assigned information bits in the group into one or more code blocks. For example, network node 120 may segment the assigned information bits in the group into one or more code blocks according to any of the embodiments or examples described above (e.g., Step 3a described above).

In particular embodiments, the wireless transmitter segments the assigned information bits in the group into one or more code blocks is based on at least one of a MCS for the wireless transmission, a number of PRBs in a scheduling assignment for the wireless transmission, and a transport block size for the wireless transmission.

At step 220, the wireless transmitter encodes each code block into coded bits. For example, network node 120 may encode each code block into coded bits according to any of the embodiments or examples described above (e.g., Step 3b described above).

At step 222, the wireless transmitter assigns the coded bits of the one or more code blocks to the group of modulation symbols the information bits are assigned to. For example, network node 120 may assign the coded bits of the one or more code blocks to the group of modulation symbols the information bits are assigned to according to any of the embodiments or examples described above (e.g., Step 3c described above). Steps 218 to 222 may be repeated for each of the groups.

At step 224, the wireless transmitter transmits the group of modulation symbols to a wireless receiver. For example, network node 120 may transmit the group of modulation symbols to wireless device 110.

Modifications, additions, or omissions may be made to method 200. Additionally, one or more steps in method 200 of FIG. 2A may be performed in parallel or in any suitable order. The steps of method 200 may be repeated over time as necessary.

Figure 3B:
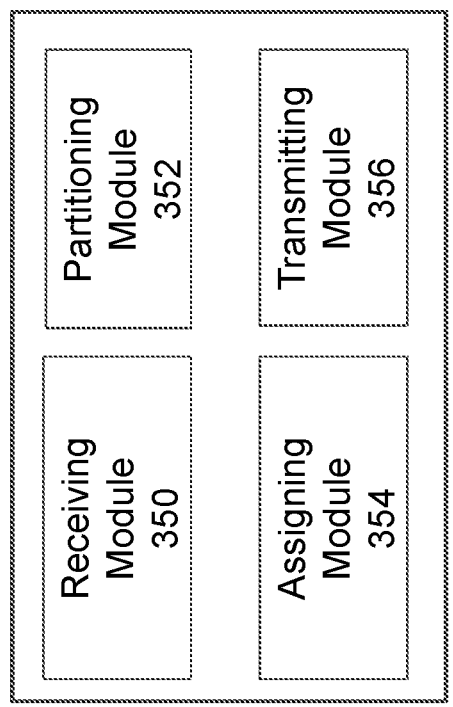
FIG. 3B is a block diagram illustrating example components of a wireless device.
Figure 3A:
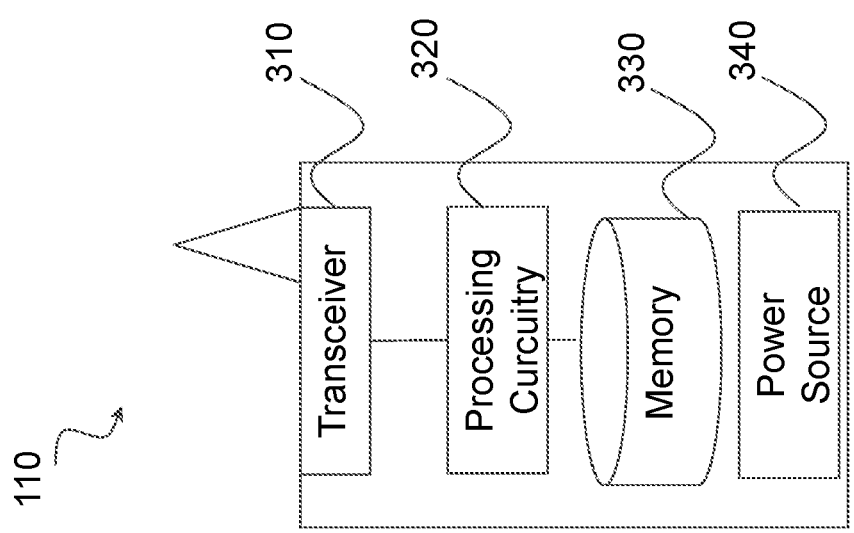
FIG. 3A is a block diagram illustrating an example embodiment of a wireless device.

FIG. 3A is a block diagram illustrating an example embodiment of a wireless device. The wireless device is an example of the wireless devices 110 illustrated in FIG. 1. In particular embodiments, the wireless device is capable of partitioning a plurality of modulation symbols into groups of one or more modulation symbols, wherein the modulation symbols in a group are contiguous in time; assigning each of the information bits to one of the groups; and for each of the groups: segmenting the assigned information bits in the group into one or more code blocks; encoding each code block into coded bits; and assigning the coded bits of the one or more code blocks to the group of modulation symbols the information bits are assigned to. The wireless device is capable of transmitting the group of modulation symbols to a wireless receiver.

Particular examples of a wireless device include a mobile phone, a smart phone, a PDA (Personal Digital Assistant), a portable computer (e.g., laptop, tablet), a sensor, a modem, a machine type (MTC) device/machine to machine (M2M) device, laptop embedded equipment (LEE), laptop mounted equipment (LME), USB dongles, a device-to-device capable device, a vehicle-to-vehicle device, or any other device that can provide wireless communication. The wireless device includes transceiver 310, processing circuitry 320, memory 330, and power source 340. In some embodiments, transceiver 310 facilitates transmitting wireless signals to and receiving wireless signals from wireless network node 120 (e.g., via an antenna), processing circuitry 320 executes instructions to provide some or all of the functionality described herein as provided by the wireless device, and memory 330 stores the instructions executed by processing circuitry 320. Power source 340 supplies electrical power to one or more of the components of wireless device 110, such as transceiver 310, processing circuitry 320, and/or memory 330.

Processing circuitry 320 includes any suitable combination of hardware and software implemented in one or more integrated circuits or modules to execute instructions and manipulate data to perform some or all of the described functions of the wireless device. In some embodiments, processing circuitry 320 may include, for example, one or more computers, one more programmable logic devices, one or more central processing units (CPUs), one or more microprocessors, one or more applications, and/or other logic, and/or any suitable combination of the preceding processing circuitry 320 may include analog and/or digital circuitry configured to perform some or all of the described functions of wireless device 110. For example, processing circuitry 320 may include resistors, capacitors, inductors, transistors, diodes, and/or any other suitable circuit components.

Memory 330 is generally operable to store computer executable code and data. Examples of memory 330 include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or or any other volatile or non-volatile, non-transitory computer-readable and/or computer-executable memory devices that store information.

Power source 340 is generally operable to supply electrical power to the components of wireless device 110. Power source 340 may include any suitable type of battery, such as lithium-ion, lithium-air, lithium polymer, nickel cadmium, nickel metal hydride, or any other suitable type of battery for supplying power to a wireless device. In particular embodiments, processing circuitry 320 in communication with transceiver 310 partitions a plurality of modulation symbols into groups of one or more modulation symbols, wherein the modulation symbols in a group are contiguous in time; assigns each of the information bits to one of the groups; and for each of the groups: segments the assigned information bits in the group into one or more code blocks; encodes each code block into coded bits; and assigns the coded bits of the one or more code blocks to the group of modulation symbols the information bits are assigned to. Processing circuitry 320 in communication with transceiver 310 may transmit the group of modulation symbols to a wireless receiver.

Other embodiments of the wireless device may include additional components (beyond those shown in FIG. 3A) responsible for providing certain aspects of the wireless device's functionality, including any of the functionality described above and/or any additional functionality (including any functionality necessary to support the solution described above).

FIG. 3B is a block diagram illustrating example components of a wireless device 110. The components may include receiving module 350, partitioning module 352, assigning module 354, and transmitting module 356.

Receiving module 350 may perform the receiving functions of wireless device 110. For example, receiving module 350 may receive a block of information bits for wireless transmission in a plurality of modulation symbols, according to any of the embodiments or examples described above (e.g., step 212 of FIG. 2). In certain embodiments, receiving module 350 may include or be included in processing circuitry 320. In particular embodiments, receiving module 350 may communicate with partitioning module 352, assigning module 354, and transmitting module 356.

Partitioning module 352 may perform the partitioning functions of wireless device 110. For example, partitioning module 352 may partition the plurality of modulation symbols into groups of one or more modulation symbols, according to any of the embodiments or examples described above (e.g., step 214 of FIG. 2). In certain embodiments, partitioning module 352 may include or be included in processing circuitry 320. In particular embodiments, partitioning module 352 may communicate with receiving module 350, assigning module 354, and transmitting module 356.

Assigning module 354 may perform the assigning functions of wireless device 110. For example, assigning module 354 may assign each of the information bits to one of the groups according to any of the embodiments or examples described above. Assigning module 354 may perform steps 216-222 of FIG. 2. In certain embodiments, assigning module 354 may include or be included in processing circuitry 320. In particular embodiments, assigning module 354 may communicate with receiving module 350, partitioning module 352, and transmitting module 356.

Transmitting module 356 may perform the transmitting functions of wireless device 110. For example, transmitting module 356 may transmit the group of modulation symbols to a wireless receiver, such as network node 120. In certain embodiments, transmitting module 356 may include or be included in processing circuitry 320. In particular embodiments, transmitting module 356 may communicate with receiving module 350, partitioning module 352, and assigning module 354.

Figure 4B:
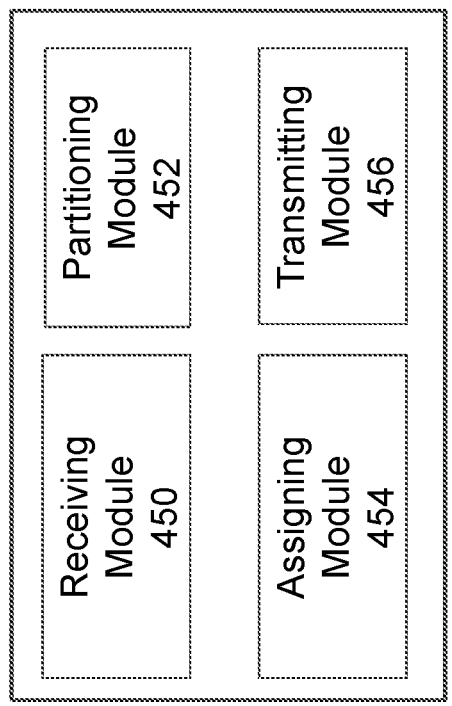
FIG. 4B is a block diagram illustrating example components of a network node.
Figure 4A:
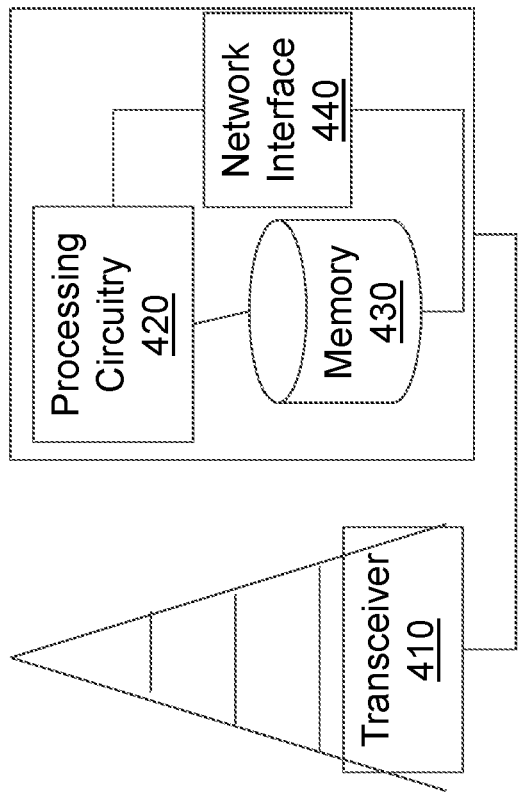
FIG. 4A is a block diagram illustrating an example embodiment of a network node.

FIG. 4A is a block diagram illustrating an example embodiment of a network node. The network node is an example of the network node 120 illustrated in FIG. 1. In particular embodiments, the network node is capable of partitioning a plurality of modulation symbols into groups of one or more modulation symbols, wherein the modulation symbols in a group are contiguous in time; assigning each of the information bits to one of the groups; and for each of the groups: segmenting the assigned information bits in the group into one or more code blocks; encoding each code block into coded bits; and assigning the coded bits of the one or more code blocks to the group of modulation symbols the information bits are assigned to. The network node is capable of transmitting the group of modulation symbols to a wireless receiver.

Network node 120 can be an eNodeB, a nodeB, gNB, a base station, a wireless access point (e.g., a Wi-Fi access point), a low power node, a base transceiver station (BTS), a transmission point or node, a remote RF unit (RRU), a remote radio head (RRH), or other radio access node. The network node includes at least one transceiver 410, processing circuitry 420, at least one memory 430, and at least one network interface 440. Transceiver 410 facilitates transmitting wireless signals to and receiving wireless signals from a wireless device, such as wireless devices 110 (e.g., via an antenna); processing circuitry 420 executes instructions to provide some or all of the functionality described above as being provided by a network node 120; memory 430 stores the instructions executed by processing circuitry 420; and network interface 440 communicates signals to backend network components, such as a gateway, switch, router, Internet, Public Switched Telephone Network (PSTN), controller, and/or other network nodes 120. Processing circuitry 420 and memory 430 can be of the same types as described with respect to processing circuitry 320 and memory 330 of FIG. 3A above.

In some embodiments, network interface 440 is communicatively coupled to processing circuitry 420 and refers to any suitable device operable to receive input for network node 120, send output from network node 120, perform suitable processing of the input or output or both, communicate to other devices, or any combination of the preceding. Network interface 440 includes appropriate hardware (e.g., port, modem, network interface card, etc.) and software, including protocol conversion and data processing capabilities, to communicate through a network. In particular embodiments, processing circuitry 420 in communication with transceiver 410 partitions a plurality of modulation symbols into groups of one or more modulation symbols, wherein the modulation symbols in a group are contiguous in time; assigns each of the information bits to one of the groups; and for each of the groups: segments the assigned information bits in the group into one or more code blocks; encodes each code block into coded bits; and assigns the coded bits of the one or more code blocks to the group of modulation symbols the information bits are assigned to. Processing circuitry 420 in communication with transceiver 410 may transmit the group of modulation symbols to a wireless receiver.

Other embodiments of network node 120 include additional components (beyond those shown in FIG. 3A) responsible for providing certain aspects of the network node's functionality, including any of the functionality described above and/or any additional functionality (including any functionality necessary to support the solution described above). The various different types of network nodes may include components having the same physical hardware but configured (e.g., via programming) to support different radio access technologies, or may represent partly or entirely different physical components.

FIG. 4B is a block diagram illustrating example components of a network node 120. The components may include receiving module 450, partitioning module 452, assigning module 454, and transmitting module 456.

Receiving module 450 may perform the receiving functions of network node 120. For example, receiving module 450 may receive a block of information bits for wireless transmission in a plurality of modulation symbols, according to any of the embodiments or examples described above (e.g., step 212 of FIG. 2). In certain embodiments, receiving module 450 may include or be included in processing circuitry 420. In particular embodiments, receiving module 450 may communicate with partitioning module 452, assigning module 454, and transmitting module 456.

Partitioning module 452 may perform the partitioning functions of network node 120. For example, partitioning module 452 may partition the plurality of modulation symbols into groups of one or more modulation symbols, according to any of the embodiments or examples described above (e.g., step 214 of FIG. 2). In certain embodiments, partitioning module 452 may include or be included in processing circuitry 420. In particular embodiments, partitioning module 452 may communicate with receiving module 450, assigning module 454, and transmitting module 456.

Assigning module 454 may perform the assigning functions of network node 120. For example, assigning module 454 may assign each of the information bits to one of the groups according to any of the embodiments or examples described above. Assigning module 454 may perform steps 216-222 of FIG. 2. In certain embodiments, assigning module 454 may include or be included in processing circuitry 420. In particular embodiments, assigning module 454 may communicate with receiving module 450, partitioning module 452, and transmitting module 456.

Transmitting module 456 may perform the transmitting functions of network node 120. For example, transmitting module 456 may transmit the group of modulation symbols to a wireless receiver, such as network node 120. In certain embodiments, transmitting module 456 may include or be included in processing circuitry 420. In particular embodiments, transmitting module 456 may communicate with receiving module 450, partitioning module 452, and assigning module 454.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the claims below.

Abbreviations used in the preceding description include:
3GPP Third Generation Partnership Project
BLER Block Error Rate
BTS Base Transceiver Station
CBG Code Block Group
CBS Code Block Segmentation
CRC Cyclic Redundancy Check
D2D Device to Device
DL Downlink
eNB eNodeB
FDD Frequency Division Duplex
LDPC low-density Parity Check
LTE Long Term Evolution
M2M Machine to Machine
MCS Modulation and Coding Scheme
MIMO Multi-Input Multi-Output
MTC Machine Type Communication
NR New Radio
OFDM Orthogonal Frequency Division Multiplex
PRB Physical Resource Block
RAN Radio Access Network
RAT Radio Access Technology RB Resource Block
RBS Radio Base Station
RE Resource Element
RNC Radio Network Controller
RRC Radio Resource Control
RRH Remote Radio Head
RRU Remote Radio Unit
SC-FDMA Single Carrier-Frequency Division Multiple Access
SIC Successive Interference Cancellation
TDD Time Division Duplex
TBS Transport Block Size
TTI Transmission Time Interval
UE User Equipment
UL Uplink
URLLC Ultra-Reliable Low Latency Communication
UTRAN Universal Terrestrial Radio Access Network
WAN Wireless Access Network

The invention claimed is:

1. A method in a wireless transmitter of aligning code blocks with modulation symbols, the method comprising:
receiving a block of information bits for wireless transmission in a plurality of modulation symbols;
partitioning the plurality of modulation symbols into groups of one or more modulation symbols, wherein the modulation symbols in a group are contiguous in time;
assigning each of the information bits to one of the groups;
for each of the groups of the one or more modulation symbols:
segmenting the assigned information bits in the group of the one or more modulation symbols into one or more code blocks;
aligning the one or more code blocks in the group of the one or more modulation symbols to boundaries of the group, wherein an integer number of code blocks is transmitted in each modulation symbol in the group of the one or more modulation symbols;
encoding each code block into coded bits;
assigning the coded bits of the one or more code blocks to the group of the one or more modulation symbols the information bits are assigned to; and
transmitting the groups of the one or more modulation symbols to a wireless receiver;
the partitioning of the plurality of modulation symbols being based on a weighting factor assigned to each modulation symbol of the plurality of modulation symbols and the weighting factor being based on a power level associated with the modulation symbol.

2. The method of claim 1, wherein each of the one or more code blocks are of equal size.

3. The method of claim 1, wherein the plurality of modulation symbols comprise a plurality of orthogonal frequency division multiplexing (OFDM) symbols.

4. The method of claim 1, wherein segmenting the assigned information bits in the group into one or more code blocks is based on at least one of a modulation and coding scheme (MCS) for the wireless transmission, a number of physical resource blocks (PRBs) in a scheduling assignment for the wireless transmission, and a transport block size for the wireless transmission.

5. The method of claim 1, wherein the weighting factor is based on a number of resource elements in the modulation symbol available for data transmission.

6. The method of claim 1, wherein the wireless transmitter comprises a network node.

7. The method of claim 1, wherein the wireless transmitter comprises a wireless device.

8. A wireless transmitter comprising processing circuitry the processing circuitry operable to:
receive a block of information bits for wireless transmission in a plurality of modulation symbols;
partition the plurality of modulation symbols into groups of one or more modulation symbols, wherein the modulation symbols in a group are contiguous in time;
assign each of the information bits to one of the groups;
for each of the groups of the one or more modulation symbols:
segment the assigned information bits in the group of the one or more modulation symbols into one or more code blocks;
align the one or more code blocks in the group of the one or more modulation symbols to boundaries of the group, wherein an integer number of code blocks is transmitted in each modulation symbol in the group of the one or more modulation symbols;
encode each code block into coded bits;
assign the coded bits of the one or more code blocks to the group of the one or more modulation symbols the information bits are assigned to; and
transmit the groups of the one or more modulation symbols to a wireless receiver;
the partitioning of the plurality of modulation symbols being based on a weighting factor assigned to each modulation symbol of the plurality of modulation symbols and the weighting factor being based on a power level associated with the modulation symbol.

9. The wireless transmitter of claim 8, wherein each of the one or more code blocks are of equal size.

10. The wireless transmitter of claim 8, wherein the plurality of modulation symbols comprise a plurality of orthogonal frequency division multiplexing (OFDM) symbols.

11. The wireless transmitter of claim 8, wherein the processing circuitry is operable to segment the assigned information bits in the group into one or more code blocks based on at least one of a modulation and coding scheme (MCS) for the wireless transmission, a number of physical resource blocks (PRBs) in a scheduling assignment for the wireless transmission, and a transport block size for the wireless transmission.

12. The wireless transmitter of claim 8, wherein the weighting factor is based on a number of resource elements in the modulation symbol available for data transmission.

13. The wireless transmitter of claim 8, wherein the wireless transmitter comprises a network node.

14. The wireless transmitter of claim 8, wherein the wireless transmitter comprises a wireless device.

* * * * *